(12) United States Patent
Kuna et al.

(10) Patent No.: US 11,892,663 B2
(45) Date of Patent: Feb. 6, 2024

(54) ARTICLE INCLUDING A WAVELENGTH SELECTIVE ABSORBING MATERIAL

(71) Applicant: VIAVI SOLUTIONS INC., San Jose, CA (US)

(72) Inventors: Jeffrey James Kuna, San Francisco, CA (US); Paul Thomas Kohlmann, Windsor, CA (US); Johannes P. Seydel, Petaluma, CA (US); Richard Alan Bradley, Jr., Santa Rosa, CA (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 428 days.

(21) Appl. No.: 16/918,698

(22) Filed: Jul. 1, 2020

(65) Prior Publication Data

US 2022/0003905 A1    Jan. 6, 2022

(51) Int. Cl.
*G02B 5/24*     (2006.01)
*C23C 14/06*    (2006.01)
*C23C 14/08*    (2006.01)
*G02B 1/115*    (2015.01)

(52) U.S. Cl.
CPC ............ *G02B 5/24* (2013.01); *C23C 14/0629* (2013.01); *C23C 14/08* (2013.01); *G02B 1/115* (2013.01)

(58) Field of Classification Search
CPC . G02B 5/24; G02B 1/115; G02B 5/22; G02B 5/223; G02B 5/285; G02B 5/26; C23C 14/0629; C23C 14/08
See application file for complete search history.

(56) References Cited

U.S. PATENT DOCUMENTS

| | | |
|---|---|---|
| 7,238,424 B2 | 7/2007 | Raksha et al. |
| 2007/0097509 A1 | 5/2007 | Nevitt et al. |
| 2011/0265690 A1 | 11/2011 | Schumacher et al. |
| 2017/0369709 A1 | 12/2017 | Seydel et al. |
| 2018/0045865 A1* | 2/2018 | Banerjee ............... G02B 5/285 |
| 2019/0243038 A1 | 8/2019 | Brown et al. |

FOREIGN PATENT DOCUMENTS

| | | |
|---|---|---|
| WO | 02/24818 A1 | 3/2002 |
| WO | 2020/020019 A1 | 1/2020 |

\* cited by examiner

*Primary Examiner* — Robert E. Tallman
(74) *Attorney, Agent, or Firm* — Mannava & Kang, P.C.

(57) ABSTRACT

An article including a stack of layers including a high refractive index layer and a low refractive index layer; wherein at least one layer of the stack includes a wavelength selective absorbing material; and wherein the stack of layers has a transparent region with an edge at a wavelength in which light is absorbed by the wavelength selective absorbing material, and a reflection band with an edge at a wavelength in which light is reflected is disclosed. Compositions and optical devices including the article are also disclosed. Additionally, there is disclosed a method of making the article, the composition, and the optical device.

18 Claims, 11 Drawing Sheets

ARTICLE INCLUDING A WAVELENGTH SELECTIVE ABSORBING MATERIAL

FIELD OF THE INVENTION

The present disclosure generally relates to an article including a stack of layers including a high refractive index layer and a low refractive index layer; wherein at least one layer of the stack includes a wavelength selective absorbing material; and wherein the stack of layers has a transparent region with an edge at a wavelength in which light is absorbed by the wavelength selective absorbing material, and a reflection band with an edge at a wavelength in which light is reflected. A composition and an optical device including the article are also disclosed. Additionally, there is disclosed a method of making the article, the composition, and the optical device.

BACKGROUND OF THE INVENTION

Decorative pigment applications require low color travel, good hiding, and high flop. Conventional quarter wave stack designs have made use of transparent materials having low color travel, but they exhibit poor hiding and poor flop. Alternatively, decorative pigments based on Fabry-Perot structures use metal, such as thin layers of metal, which is generally made using vacuum deposition techniques thereby increasing the cost and time of manufacture. Moreover, the use of thin layers of metal increase the risk that the decorative pigment applications will be subject to corrosion over time.

A quarter wave stack is a well-known optical design that is highly reflective within a range of the spectrum, but is transparent outside of this range. The region over which this design reflects can be selected by adjusting the thicknesses of the layers. The reflectivity in this region can even exceed the reflectivity afforded by metals, making this optical design attractive as a foundation for a special effect pigment.

What is needed is different materials that can be used in decorative pigment applications so that light that would otherwise be transmitted can be absorbed while maintaining reflectivity, thereby resulting in an opaque design, but without the use of a metal layer.

SUMMARY OF THE INVENTION

In an aspect, there is disclosed an article including a stack of layers including a high refractive index layer and a low refractive index layer; wherein at least one layer of the stack includes a wavelength selective absorbing material; and wherein the stack of layers has a transparent region with an edge at a wavelength in which light is absorbed by the wavelength selective absorbing material, and a reflection band with an edge at a wavelength in which light is reflected is disclosed.

In another aspect, there is disclosed a method of making an article, comprising: depositing onto a substrate a stack of layers including a high refractive index layer and a low refractive index layer; wherein at least one layer of the stack includes a wavelength selective absorbing material; and wherein the stack of layers has a transparent region with an edge at a wavelength in which light is absorbed by the wavelength selective absorbing material, and a reflection band with an edge at a wavelength in which light is reflected.

Additional features and advantages of various embodiments will be set forth, in part, in the description that follows, and will, in part, be apparent from the description, or can be learned by the practice of various embodiments. The objectives and other advantages of various embodiments will be realized and attained by means of the elements and combinations particularly pointed out in the description herein.

BRIEF DESCRIPTION OF THE DRAWINGS

The present disclosure in its several aspects and embodiments can be more fully understood from the detailed description and the accompanying drawings, wherein.

Throughout this specification and figures like reference numbers identify like elements.

DETAILED DESCRIPTION OF THE INVENTION

It is to be understood that both the foregoing general description and the following detailed description are exemplary and explanatory only, and are intended to provide an explanation of various embodiments of the present teachings. The layers/components shown in each Figure may be described with regard to a particular Figure, but it is understood that the description of a particular layer/component would be applicable to the equivalent layer/component in the other Figures.

In its broad and varied embodiments, disclosed herein is an article comprising a stack of layers including a high refractive index layer and a low refractive index layer; wherein at least one layer of the stack includes a wavelength selective absorbing material; and wherein the stack of layers has a transparent region with an edge at a wavelength in which light is absorbed by the wavelength selective absorbing material, and a reflection band with an edge at a wavelength in which light is reflected.

The article can be in a form of a flake, a pigment, or a foil. The pigment can be a special effect pigment. The article can be opaque. The article can be dispersed in a liquid medium to form a composition, such as an ink or paint. The composition can be applied to a substrate to form an optical device. The article can exhibit at least one property chosen from high flop (i.e., a measure of the change in lightness of a color as it is tilted through a range of viewing angles, in which "high" is greater than or equal to 10, for example, about 35, and as a further example, in a range from about 10 to about 35, such as from about 20 to about 30, low color travel (as compared to Fabry-Perot designs), or good hiding. The article, composition, and optical device will be described more fully below, as well as methods of making each.

The article can include a stack of layers including a high refractive (H) index layer and a low refractive (L) index layer. In forming the article, care should be taken to bifurcate the layers of the stack to preserve a difference in the refraction index of each layer, which can drive the reflectivity of the article. The stack can have a bottom layer, one or more middle layers, and a top layer, in which it is understood that the words "bottom" and "top" are used for ease of reference and are not limiting as to placement in the stack. In an aspect, the bottom layer and the top layer can both be low refractive index layers. In an aspect, the bottom layer and the top layer can both be high refractive index layers. In an aspect, the bottom layer can be a low refractive index layer and the top layer can be a high refractive index layer or vice versa. In another aspect, the stack of layers includes an odd number of alternating layers, for example, 3 alternating layers, 5 alternating layers, 7 alternating layers, and 9 alternating layers. For example, the article can be a stack of 5 layers with $MgF_2$ and copper (II) sulfide. In another aspect, the stack of layers includes an even number of alternating layers, for example, 4 alternating layers, 6 alternating layers, 8 alternating layers, and 10 alternating layers. The stack can have the formula (HLH)n, in which n is an integer greater than or equal to 1.

At least one layer of the stack can include a wavelength selective absorbing material. The at least one layer of the stack can include two or more different wavelength selective absorbing materials. Additionally, and/or alternatively, the stack can include two or more different wavelength selective absorbing materials, for example, in the same or different layers of the stack. In an aspect, a high refractive index layer of the stack can include the wavelength selective absorbing material. In another aspect, a low refractive index layer of the stack can include the wavelength selective absorbing material. In a further aspect, both the high refractive index layer and the low refractive index layers include the wavelength selective absorbing material. In this manner, the refractive index of each layer in the stack can be tuned. Similarly, the absorption of light in each layer can be tuned. In an aspect, the stack does not include a thin layer of absorbing metal.

The high refractive index layer can also include a high refractive index material, i.e., having a refractive index greater than greater than about 1.65. Non-limiting examples of high refractive index materials include zinc sulfide (ZnS), zinc oxide (ZnO), zirconium oxide ($ZrO_2$), titanium dioxide ($TiO_2$), diamond-like carbon, indium oxide ($In_2O_3$), indium-tin-oxide (ITO), tantalum pentoxide ($Ta_2O_5$), cerium oxide ($CeO_2$), yttrium oxide ($Y_2O_3$), europium oxide ($Eu_2O_3$), iron oxides such as (II) diiron(III) oxide ($Fe_3O_4$) and ferric oxide ($Fe_2O_3$), hafnium nitride (HfN), hafnium carbide (HfC), hafnium oxide ($HfO_2$), lanthanum oxide ($La_2O_3$), magnesium oxide (MgO), neodymium oxide ($Nd_2O_3$), praseodymium oxide ($Pr_6O_{11}$), samarium oxide ($Sm_2O_3$), antimony trioxide ($Sb_2O_3$), silicon, silicon monoxide (SiO), selenium trioxide ($Se_2O_3$), tin oxide ($SnO_2$), tungsten trioxide ($WO_3$), or their combinations.

The low refractive index layer can also include a low refractive index material, i.e., having a refractive index less than about 1.65. Non-limiting examples of low refractive index materials include silicon dioxide ($SiO_2$), aluminum oxide ($Al_2O_3$), metal fluorides such as magnesium fluoride ($MgF_2$), aluminum fluoride ($AlF_3$), cerium fluoride ($CeF_3$), lanthanum fluoride ($LaF_3$), sodium aluminum fluorides (e.g., $Na_3AlF_6$ or $Na_5Al_3F_{14}$), neodymium fluoride ($NdF_3$), samarium fluoride ($SmF_3$), barium fluoride ($BaF_2$), calcium fluoride ($CaF_2$), lithium fluoride (LiF), or their combinations. Organic monomers and polymers can be utilized as low refractive index materials, including dienes or alkenes such as acrylates (e.g., methacrylate), perfluoroalkenes, polytetrafluoroethylene (Teflon), fluorinated ethylene propylene (FEP), or their combinations thereof.

In the article, one or more layers of the stack can include a wavelength selective absorbing material. In an aspect, the wavelength selective absorbing material can be dispersed in a liquid medium for deposition as a layer in a liquid coating process. The wavelength selective absorbing material can include a metal sulfide, a ternary system, a metal oxide, a pigment, a dye, and combinations thereof. In an aspect, the wavelength selective absorbing material can be a composite of a polymer material and an absorbing pigment. A wavelength absorbing material can have minimal absorption where reflection is desired. A wavelength absorbing material can also limit color travel as compared to a pigment constructed with a Fabry-Perot structure.

The wavelength selective absorbing material can be a metal oxide. Non-limiting examples of a metal oxide include CuO, $SiO_2$, $TiO_2$, $Al_2O_3$, $ZrO_2$, $WO_3$, $VO_5$, ITO, $Ta_2O_5$, $CeO_2$, $Y_2O_3$, $Sc_2O_3$, ZnO, $In_2O_3$, $La_2O_3$, MgO, $Nd_2O_3$, $Pr_6O_{11}$, $Fe_2O_3$, $Fe_3O_4$, SiO, $SnO_2$, $FeO_x$ (where x is an integer greater than 0), and their combinations.

The wavelength selective absorbing material can be a metal sulfide. Non-limiting examples of a metal sulfide include copper (I) sulfide, tin sulfide, nickel sulfide, silver sulfide, lead sulfide, molybdenum sulfide, iron disulfide, zinc sulfide, or combinations thereof. Complex ternary systems can also be used such as chalcopyrite and bornite.

The wavelength selective absorbing material can be an organic colored material, such as a dye. Any dye recognized in the Colour Index™ published by the Society of Dyers and Colourists can be used. Non-limiting examples of an organic colored material include carbon, graphite, perylene, perinone, quinacridone, pyrrole, quinacridonequinone, anthrapyrimidine, anthraquinone, anthanthrone, benzimidazolone, disazo condensation, azo, quinolones, xanthene, azomethine, quinophthalone, indanthrone, phthalocyanine, triarylcarbonium, dioxazine, aminoanthraquinone, isoindoline, diketopyrrolopyrrole, thioindigo, thiazineindigo, isoindolinone, pyranthrone, isoviolanthrone, miyoshi methane, triarylmethane, or mixtures thereof. The organic colored material can also be cobalt green, cobalt blue, Prussian blue, and manganese violet.

The wavelength selective absorbing material can be a pigment, such as an absorbing pigment. Any pigment recognized in the Colour Index™ published by the Society of Dyers and Colourists can be used. Non-limiting examples of pigments include C.I. Pigment Red 123 (C.I. No. 71 145), C.I. Pigment Red 149 (C.I. No. 71 137), C.I. Pigment Red 178 (C.I. No. 71 155), C.I. Pigment Red 179 (C.I. No. 71 130), C.I. Pigment Red 190 (CI 71 140), C.I. Pigment Red 224 (C.I. No. 71 127), C.I. Pigment Violet 29 (C.I. No. 71

129), C.I. Pigment Orange 43 (C.I. No. 71 105), C.I. Pigment Red 194 (C.I. No. 71 100), C.I. Pigment Violet 19 (C.I. No. 73 900), C.I. Pigment Red 122 (C.I. No. 73 915), C.I. Pigment Red 192, C.I. Pigment Red 202 (C.I. No. 73 907), C.I. Pigment Red 207, C.I. Pigment Red 209 (C.I. No. 73 905), C.I. Pigment Red 206 (C.I. No. 73 900/73 920), C.I. Pigment Orange 48 (C.I. No. 73 900/73 920), C.I. Pigment Orange 49 (C.I. No. 73 900/73 920), C.I. Pigment Orange 42, C.I. Pigment Yellow 147, C.I. Pigment Red 168 (C.I. No. 59 300), C.I. Pigment Yellow 120 (C.I. No. 11 783), C.I. Pigment Yellow 151 (C.I. No. 13 980), C.I. Pigment Brown 25 (C.I. No. 12 510), C.I. Pigment Violet 32 (C.I. No. 12 517), C.I. Pigment Orange 64; C.I. Pigment Brown 23 (C.I. No. 20 060), C.I. Pigment Red 166 (C.I. No. 20 730), C.I. Pigment Red 170 (C.I. No. 12 475), C.I. Pigment Orange 38 (C.I. No. 12 367), C.I. Pigment Red 188 (C.I. No. 12 467), C.I. Pigment Red 187 (C.I. No. 12 486), C.I. Pigment Orange 34 (C.I. No. 21 115), C.I. Pigment Orange 13 (C.I. No. 21 110), C.I. Pigment Red 9 (C.I. No. 12 460), 0.1. Pigment Red 2 (C.I. No. 12 310), C.I. Pigment Red 112 (C.I. No. 12 370), C.I. Pigment Red 7 (C.I. No. 12 420), C.I. Pigment Red 210 (C.I. No. 12 477), C.I. Pigment Red 12 (C.I. No. 12 385), C.I. Pigment Blue 60 (C.I. No. 69 800), C.I. Pigment Green 7 (C.I. No. 74 260), C.I. Pigment Green 36 (C.I. No. 74 265); C.I. Pigment Blue 15:1, 15:2, 15:3, 15:4, 15:6 and 15 (C.I. No. 74 160); C.I. Pigment Blue 56 (C.I. No. 42 800), C.I. Pigment Blue 61 (C.I. No. 42 765:1), C.I. Pigment Violet 23 (C.I. No. 51 319), C.I. Pigment Violet 37 (C.I. No. 51 345), C.I. Pigment Red 177 (C.I. No. 65 300), C.I. Pigment Red 254 (C.I. No. 56 110), C.I. Pigment Red 255 (C.I. No. 56 1050), C.I. Pigment Red 264, C.I. Pigment Red 270, CI Pigment Red 272 (C.I. No. 56 1150), C.I. Pigment Red 71, C.I. Pigment Orange 73, C.I. Pigment Red 88 (C.I. No. 73 312), C.I. Pigment Yellow 175 (C.I. No. 11 784), C.I. Pigment Yellow 154 (C.I. No. 11 781), C.I. Pigment Yellow 83 (C.I. No. 21 108), C.I. Pigment Yellow 180 (C.I. No. 21 290), C.I. Pigment Yellow 181 (C.I. No. 11 777), C.I. Pigment Yellow 74 (C.I. No. 11 741), C.I. Pigment Yellow 213, C.I. Pigment Orange 36 (C.I. No. 11 780), C.I. Pigment Orange 62 (CI No. 11 775), C.I. Pigment Orange 72, C.I. Pigment Red 48:2/3/4 (C.I. No. 15 865:2/3/4), C.I. Pigment Red 53:1 (C.I. No. 15 585:1), C.I. Pigment Red 208 (C.I. No. 12 514), C.I. Pigment Red 185 (C.I. No. 12 516), C.I. Pigment Red 247 (C.I. No. 15 915), Pigment Black 31 ($C_{40}H_{26}N_2O_4$), Pigment Orange 16 ($C_{32}H_{24}C_{12}N_8O_2$), or combinations thereof.

In the article, the stack of layers can have a transparent region with an edge at a wavelength in which light is absorbed by the wavelength selective absorbing material, and a reflection band with an edge at a wavelength in which light is reflected. The transparent region and the reflection band of the article are explained below. In an aspect, a wavelength selective absorbing material can have limited to no absorption where the reflectance should be maximal, and controlled absorption outside of the reflection band.

Comparative Example

Figure 1:
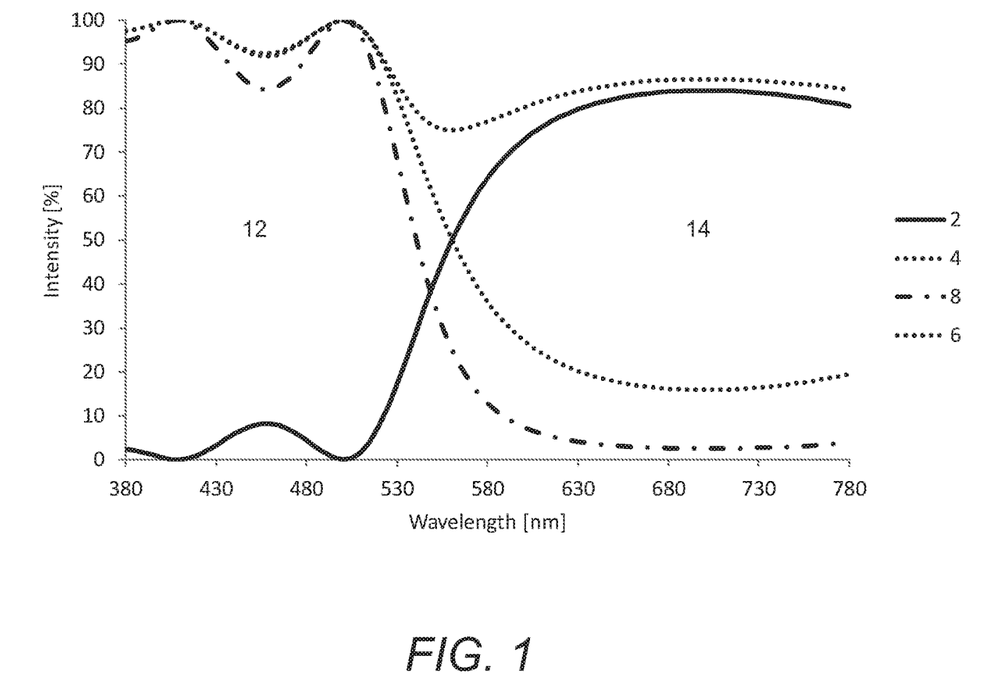
FIG. 1 is a graph illustrating the reflectance and transmittance of a convention quarter wave reflector including transparent materials.

An article was prepared having a stack of 5 transparent layers, i.e., three high refractive index layers, in which n=2.3, and two low refractive index layers, in which n=1.3; and was centered at 700 nm. The optical design of the article was modeled in an effort to maximize reflection where desired and prevent transmission everywhere else. Referring to FIG. 1, the optical design shows the reflection curve 2, the transmittance curve 4, the square of transmittance 8, and the overall reflection 6; and the edge 10 between the reflection band and the transparent region. The reflection band 14 is an area around the center wavelength in which there is high reflectance 2 and low transmittance 4, and can be generally described in relation to this particular article, as to the right of the edge 10. The transparent region 12 is an area other than the reflection band 14, such as the wavelengths with low reflection 2 and high transmittance 4.

Figure 2:
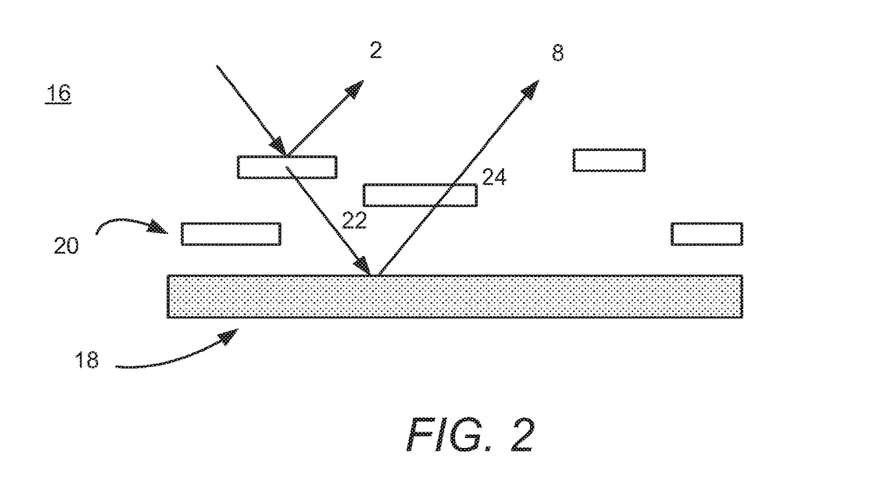
FIG. 2 is a graphical illustrating overall reflectance for a pigment.

However, it is noted that an optical device 16 prepared with the article designed in FIG. 1, would not have the same reflection curve 2, but would instead have the overall reflection curve 6. FIG. 2 illustrates a composition including the article 20 dispersed in a liquid medium (not shown) applied onto a surface of a substrate 18. The overall reflected light from the optical device 16 would actually include the light 22 that is transmitted through the article 20 and reflected off the underlying substrate 18. Additionally, the same light that reflects off the substrate 20 can also pass through (e.g., light ray 24) another article 20. The maximum intensity of light is the square of transmittance ($T^2$) 8. The overall reflection (OAR) 6 is therefore the sum of the initial reflection 2 and the square transmittance 8; $OAR=R+T^2$. The article having the stack of 5 transparent layers had poor hiding and low chromaticity.

Example 1

Figure 3:
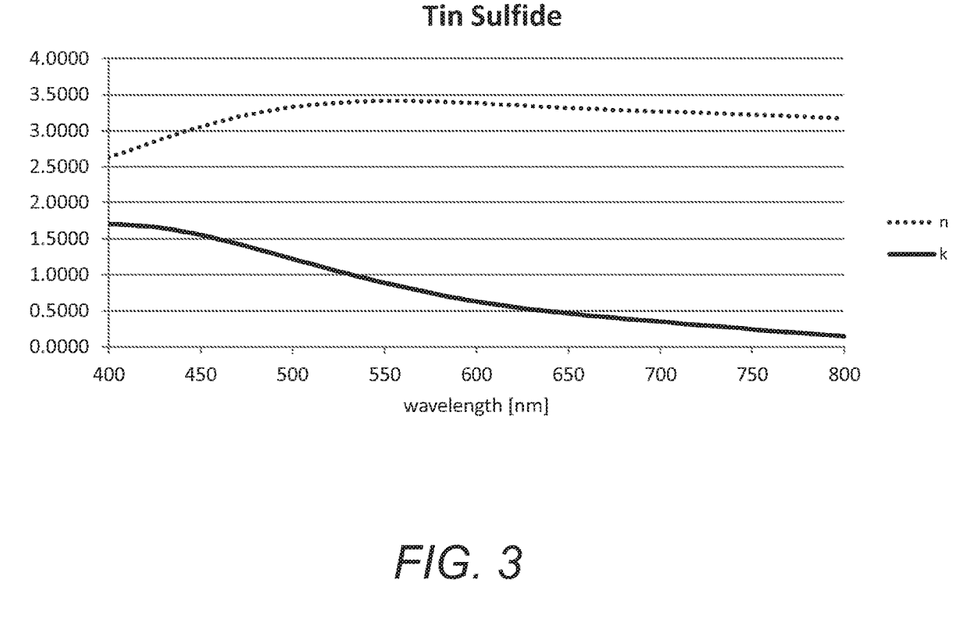
FIG. 3 is a graph illustrating the tin sulfide constants.

An article including a stack of layers of high refractive index layers and low refractive index layers was made. At least one layer of the stack included a wavelength selective absorbing material, such as copper sulfide, tin sulfide, or iron oxide as a high refractive index material; and magnesium fluoride as a low refractive index material. As shown in FIG. 3, tin sulfide can be used as wavelength selective absorbing material because it absorbs strongly at short wavelengths and less strongly at longer wavelengths. Another exemplary wavelength selective absorbing material would have little to no absorption in the reflection band.

Figure 4:
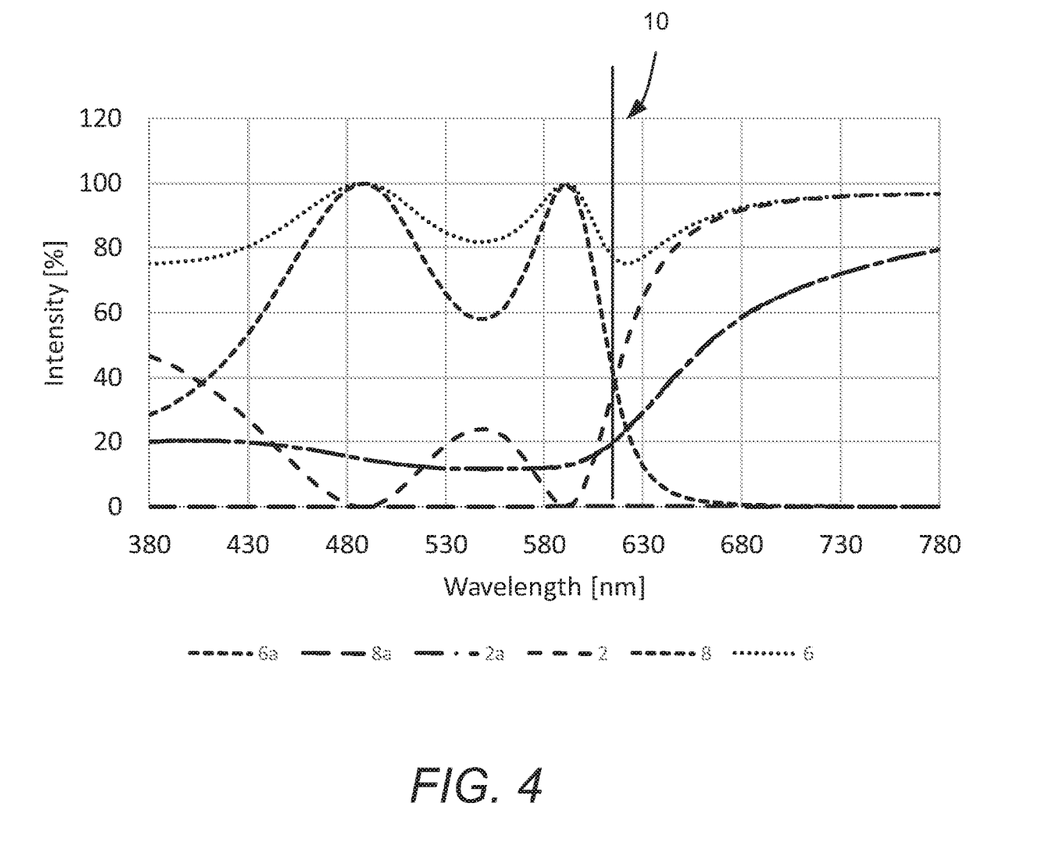
FIG. 4 is a graph illustrating the simulated performance of a 5-layer article of tin sulfide and magnesium fluoride.

FIG. 4 shows the simulated optical performance of an article prepared having a stack of 5 layers of tin sulfide and magnesium fluoride; and was centered at 850 nm. The simulation used the measured values for absorption (solid lines 2a, 6a, 8a) and a hypothetical case where the absorption for tin sulfide was set to 0 (dotted lines 2, 6, 8). Because of the strong absorption of the tin sulfide outside of the reflection band, light was effectively not transmitted 8a. The overall reflection 6a matched the reflectance 2a. When the absorbance was turned off in the simulation, the transmitted light 8 had a major effect on the overall reflected light 6 and was comparable to the reflectance 2. Tin sulfide absorbed over all wavelengths shown and negatively impacts the desired reflectance in the reflection band 630 nm-780 nm.

This example showed that when there is no absorption (i.e., when the absorption for tin sulfide was turned off in the simulation, e.g., dotted lines), the effects are similar to those in the Comparative Example using transparent layers, as shown in FIG. 1. In particular, light that is transmitted through the article 20 and reflected off the object 8 (FIGS. 1 and 4) had a significant effect on the overall reflectance 6. However, when wavelength selective absorbing material was used, the overall reflection yielded a red appearance 6a. It is noted that because tin sulfide is a high refractive, wavelength selective absorbing material, and its reflectance 6a remains higher than others at shorter wavelengths (600 nm and shorter). Use of a different wavelength selective absorbing material could reduce this reflectivity.

Example 2

Figure 5:
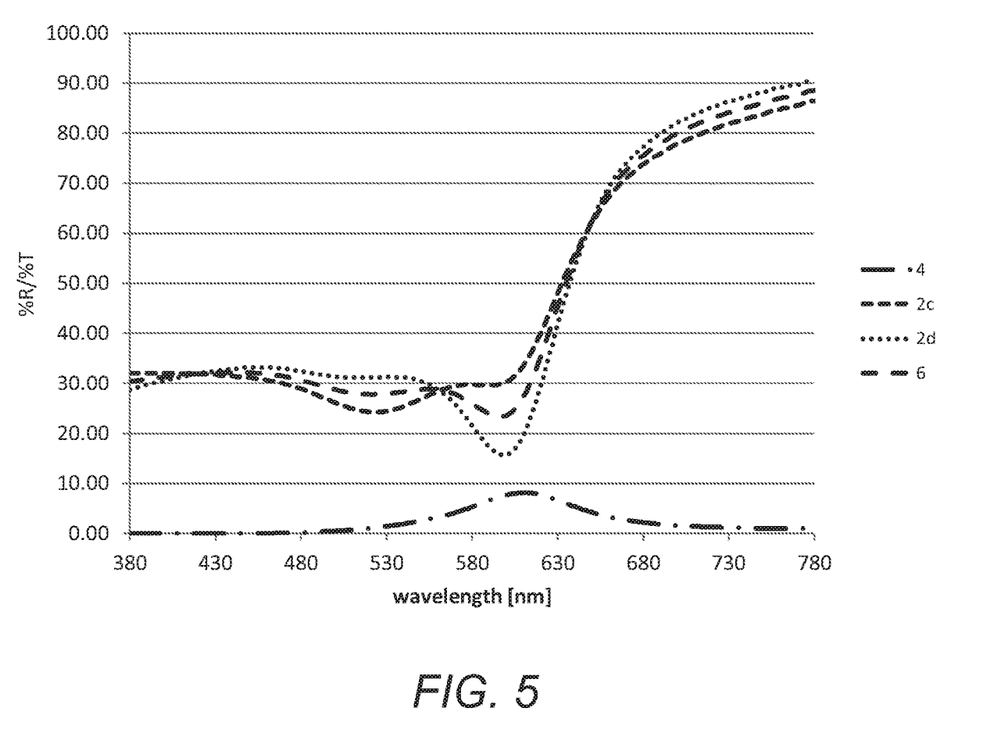
FIG. 5 is a graph illustrating the transmission and reflection data of the article of FIG. 4, after it was coated on PET with a hard coat.

An optical device 16 was prepared with a PET substrate 18, the article 20 from Example 1 in the form of a foil, and a hard coat. The transmission 4 and reflection from both sides (2c, 2d) was obtained. The overall reflection 6 was calculated after averaging 2c and 2d. The simulation shown in FIG. 5 was performed immersed in a liquid medium having a low refractive index of 15 while the foil was measured in air and only the PET side had a comparably high refractive index. Qualitatively, there was good agreement between the simulation and the experimental results. Both the simulation and foil had high reflectivity at longer wavelengths and lower reflectivity at shorter wavelengths. The foil did have a higher transmission with a peak around 600 nm that was not predicted in the simulation. This likely reflected inaccuracy in the refractive index data obtained for tin sulfide or process variations that have led to a difference in the optical constants for tin sulfide. The refractive index data was generated using a Variable Angle Spectral Ellipsometer (VASE).

The data can be used to predict how this article would perform as a composition. The two reflectivity curves 2c, 2d were averaged and the overall reflection 6 was calculated. The composition was stripped and drawdowns were prepared. The drawdowns were measured on the Hitachi spectrophotometer and the results showed good agreement with the simulation in FIG. 5. The reflectivity was lower than calculated because the predicted reflection curve was calculated from measurements taken in air. Another important point to note is the measurements between the white and black regions of the Leneta card do not vary. This was proof of good hiding.

Example 3

Three five-layer stacks were simulated centered at 450 nm, 650 nm, and 780 nm. Because iron oxide is significantly less absorbing at longer wavelengths, it was expected that the design centered at 450 nm would have leakage at longer wavelengths. Conversely, designs centered at the longer wavelengths would meet the design criteria for the new pigment described in this report and thus would have good hiding.

Figure 6:
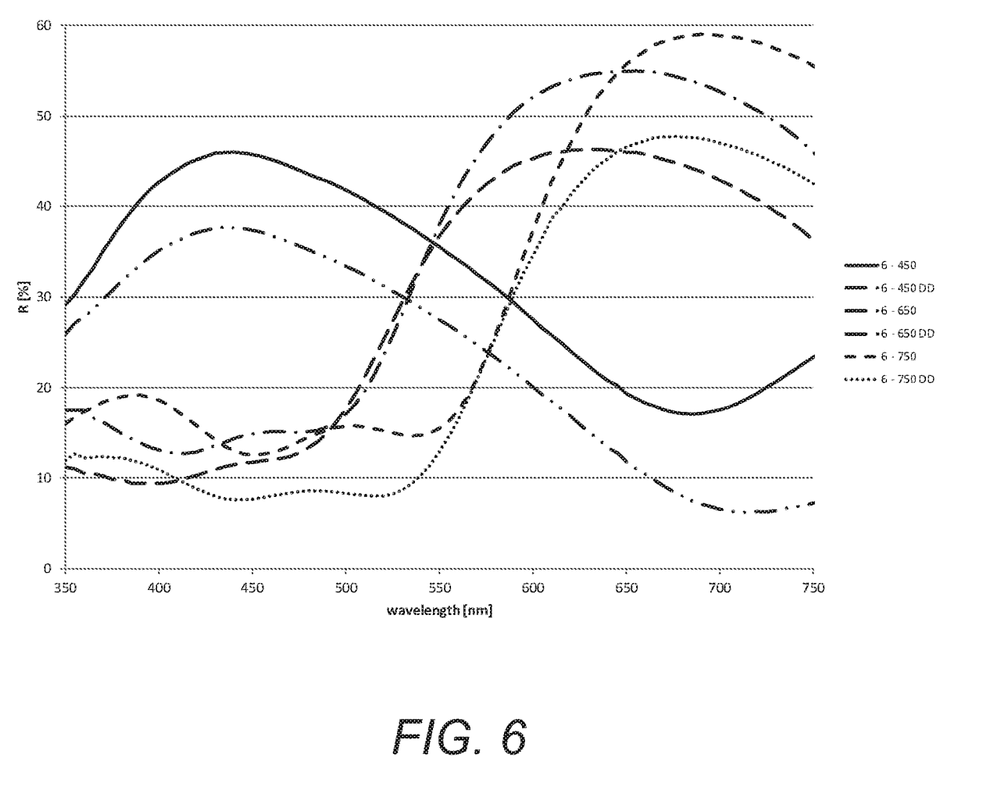
FIG. 6 is a graph comparing draw-drown overall reflection for various pigments including on white and black regions.
Figure 7:
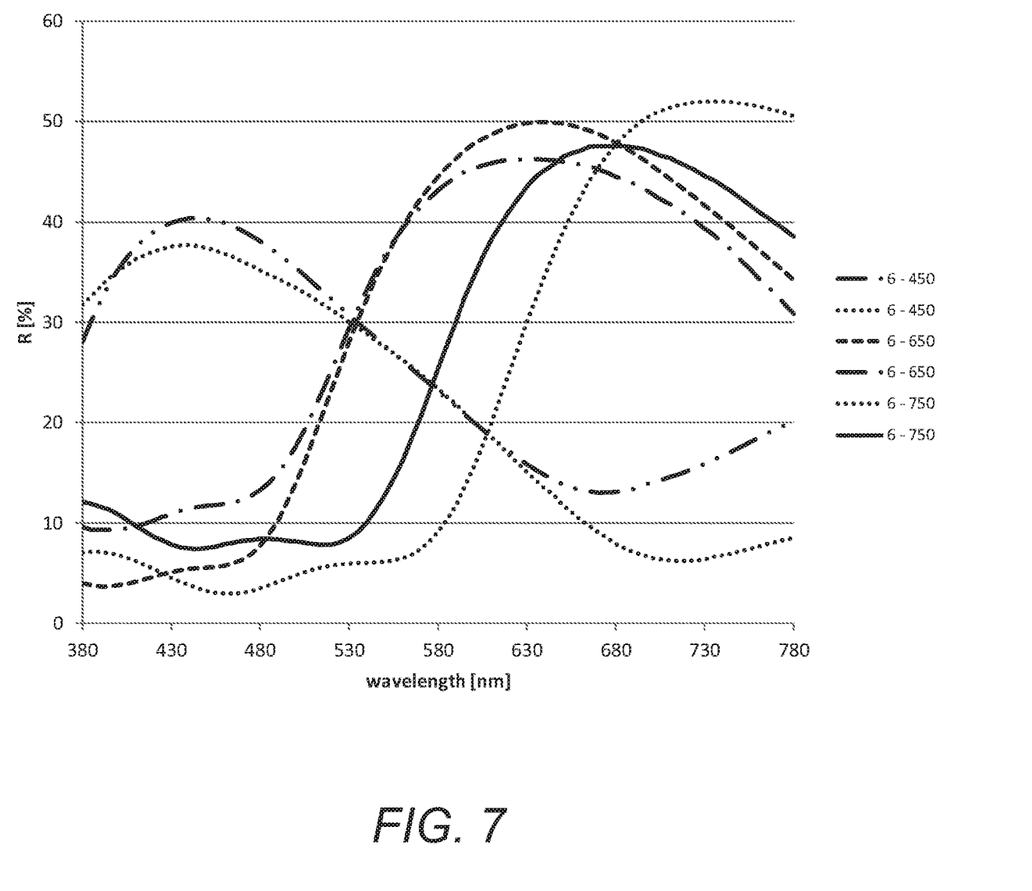
FIG. 7 is a graph comparing a computer simulation to draw down measurements for various pigments.

Using transmittance and reflectance data measured on the coated foils, the overall reflectance 6 of an article was calculated (as shown in FIG. 6, e.g., "6-450" is the overall reflectance for the stack centered at 450 nm). The foils were converted to pigment and drawdowns were prepared. Color measurements (Hunter spectrophotometer) were made on the white (dotted lines) and black regions (dashed lines) of the Leneta card for each drawdown. For each pigment design, the measurements over each region (black and white) coincided almost perfectly (e.g., "6-450 DD" is the overall reflectance for the optical device), indicating each pigment exhibited good hiding. The measured reflectance also closely matched the shape of the reflectance predicted from foil measurements, though with some losses attributable to the conversion from a flat foil to slightly misaligned flakes. Universally, it is seen that the reflectance of a design decreases when the foil is converted to pigment and this shows the difference between a smooth planar surface and air.

Example 4

The same pigments used in Example 3 were used so that the overall reflection predicted by DECO (e.g., "6-450" dotted line) was compared to the draw down measurements (e.g. "6-450" solid line). Two differences are observed. First, the blue pigment design centered at 450 nm had more hiding than expected, for example, at wavelengths longer than 680 nm. Second, the red pigment had a lower reflectance at longer wavelengths. Both of these results can be explained if the iron oxide coated during these runs had high absorption at longer wavelengths than the iron oxide coating used to obtain refractive index data (obtained by VASE). Regardless, this experiment produced a novel and surprising result. Iron oxide, normally thought of as a "red" material, could be used to produce a range of colors including blue.

Example 5

In developing a suitable article, a key driver is the difference between the refractive indices of the layers of the stack. For example, two layers with a small difference in refractive index could lead to poor performance or necessitate numerous layers to achieve the same property, such as reflectivity. Table 1 below shows the calculated reflectance for a 5-layer article centered at 550 nm. As can be seen, the reflectance is maximized when the difference between the indices is maximized (e.g., a high refractive index of 2.5 and a low refractive index of 1.3 has a reflectance of 90).

TABLE 1

R % for 5-layer article at 550 nm (in paint)

| | | High Refractive Index | | | | |
|---|---|---|---|---|---|---|
| | | 2.5 | 2.3 | 2.1 | 2 | 1.9 | 1.8 |
| Low | 1.3 | 90.0 | 84.0 | 74.1 | 66.8 | 57.7 | 46.5 |
| Refractive | 1.4 | 86.8 | 79.2 | 66.7 | 58.1 | 47.6 | 35.3 |
| Index | 1.5 | 83.0 | 73.4 | 58.6 | 48.7 | 37.2 | 24.8 |
| | 1.6 | 78.5 | 67.0 | 49.9 | 39.1 | 27.3 | 15.6 |

The use of a 7-layer design further increased the reflectivity. Adding layers to the stack increased reflectance. For example, a 7-layer design with 89% R can be achieved with wavelength selective absorbing materials with indices of 1.3 (low) and 2.1 (high) as compared to a 5-layer design.

TABLE 2

R % for 7-layer article at 550 nm (in paint)

| | | High Refractive Index | | | | |
|---|---|---|---|---|---|---|
| | | 2.5 | 2.3 | 2.1 | 2 | 1.9 | 1.8 |
| Low | 1.3 | 97.2 | 94.6 | 89.1 | 84.4 | 77.4 | 67.3 |
| Refractive | 1.4 | 95.7 | 91.7 | 83.6 | 76.7 | 67.0 | 53.8 |
| Index | 1.5 | 93.5 | 87.7 | 76.2 | 66.9 | 54.4 | 38.8 |
| | 1.6 | 90.6 | 82.5 | 67.0 | 55.2 | 40.5 | 24.0 |

The wavelength selective absorbing materials should be added in a way that increases or preserves the difference in the refractive index between the layers of the stack. For instance, an inorganic with an index around 1.9 would be more effective in a high refractive index layer while an organic dye with an index around 1.5 would be more effective in a low refractive index layer.

Example 6

To illustrate the impact absorption has in the reflection band and outside the reflection band, the following simulations were performed. The performance in the reflection band should be evaluated separately from the performance in the transparent region. In the simulations that follow, the reflection band is greater than or equal to 580 nm and the transparent region is less than 580 nm.

Figure 8:
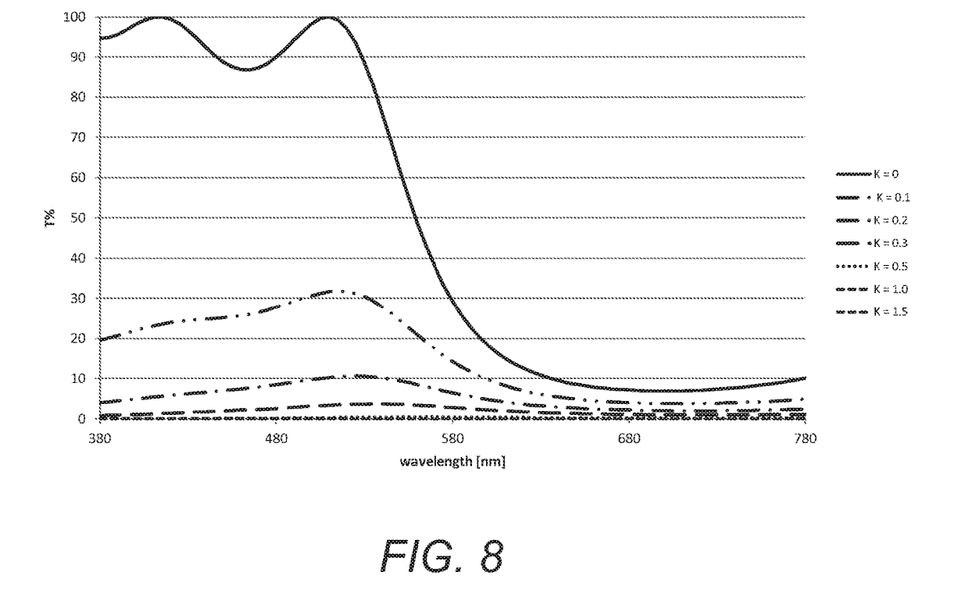
FIG. 8 is a graph illustrating how overall transmission varies for different extinction coefficients.

The overall transmission 8 is the easiest of these plots to understand (FIG. 8). The overall transmission 8 was plotted rather than the actual transmission 4 because light reflected off a painted surface will realistically be transmitted twice or more according to the model discussed in the earlier section. Thus, the overall transmission 8 of the article is the maximum contributed from the light not originally reflected.

With k=0 for the high index material, very high transmission occurred. Increasing absorption (k>0) further diminished transmission, as expected. However, once k=0.5 was reached, a point of diminishing return was found. Above 580 nm, the transmission was low as this corresponded to the reflection band.

Example 7

Figure 9:
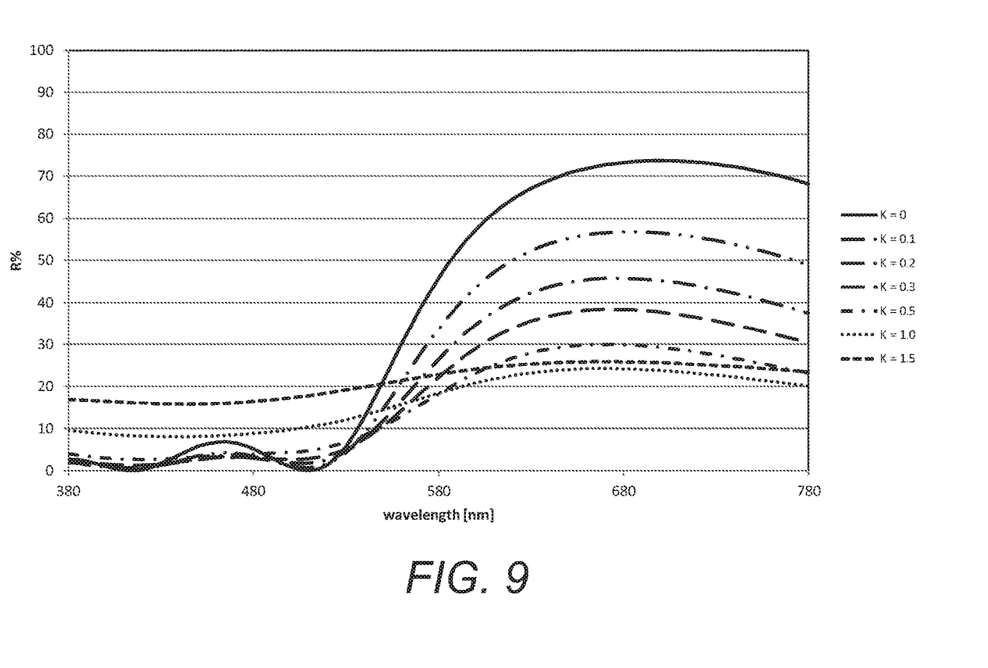
FIG. 9 is a graph illustrating reflection for various extinction coefficients.

The related reflectivity plot is shown in FIG. 9. As shown, above 580 nm where the article is highly reflective, i.e., the reflection band, increasing the absorption decreased the reflectivity. The effect of absorption was more interesting in the transparent region, i.e., less than 580 nm. It can be seen that the reflectivity initially decreased with increasing absorption until k is 0.2. With further increases in k, the reflectivity in this region actually increased. This point is likely not intuitive, as one would assume increasing absorption at wavelengths where light is undesired would reduce their intensity in the overall reflection and improve performance; in actuality, increasing absorption can boost reflectivity and lower chromaticity.

Example 8

Figure 10:
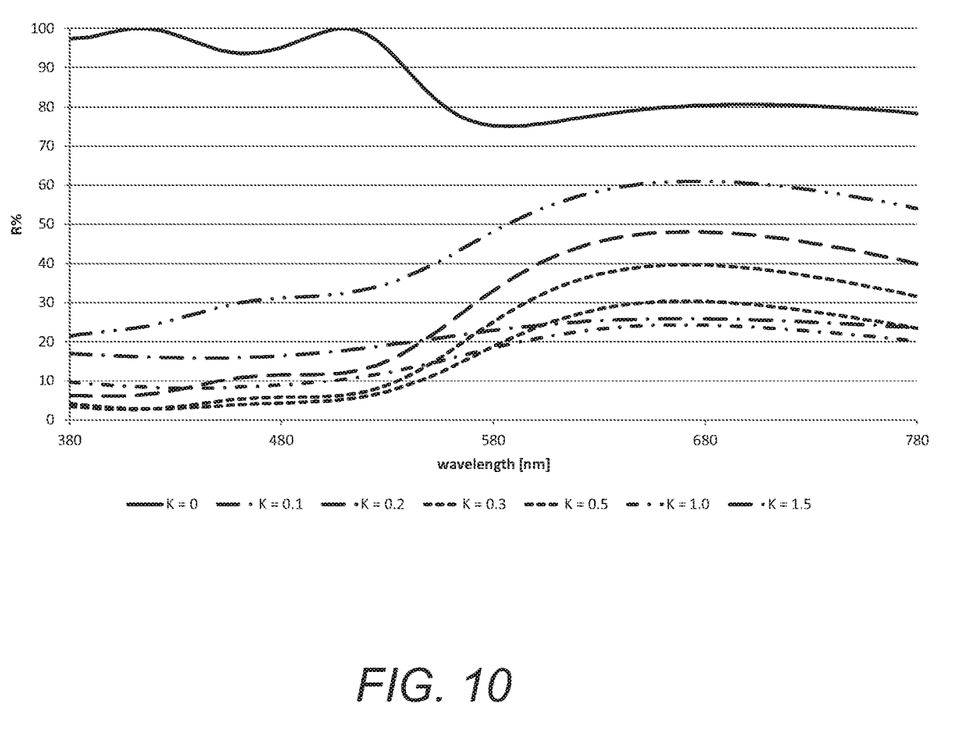
FIG. 10 is a graph illustrating how overall reflection varies for different extinction coefficients.

The data in FIGS. 8 and 9 were combined into FIG. 10 to understand the overall reflectivity 6 of an article for various k. As discussed above, at wavelengths longer than 580 nm where the article is reflective, it is desirable to have very low absorption. At wavelengths shorter than 580 nm where the article is expected to be transparent, moderate absorption is desired. As shown in FIG. 10, chromaticity was optimized when k=0.5. Values of k lower than 0.5 lead to increased reflection of the transmitted light while values of k greater than 0.5 led to boosted reflectivity.

Example 9

Figure 11:
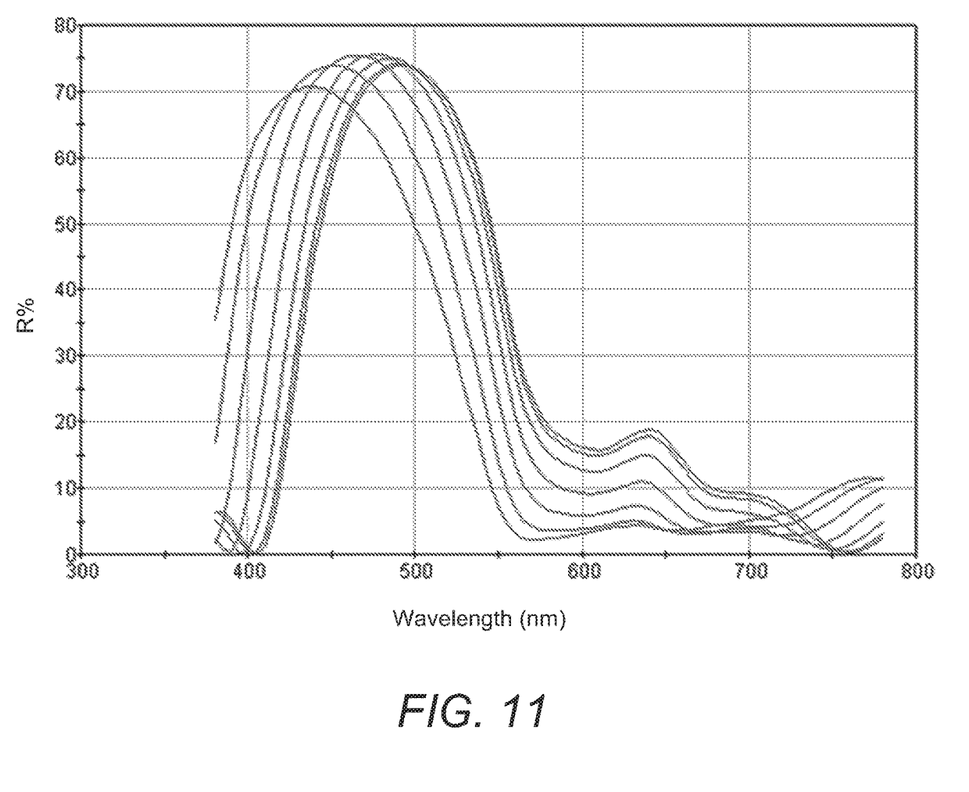
FIG. 11 is a graph illustrating reflection curves for a pigment with a color shift from 0 degrees to 60 degrees.

An article was prepared having 7 layers with a high refractive index layer (n=2.2) including copper phthalocyanine blue (30% volume) and titania (70% volume); the low refractive index layer includes a polymer with n=1.4 with no absorption. FIG. 11 shows the reflection curves 2 plotted for angles from 0 degrees to 60 degrees.

Example 10

Figure 12:
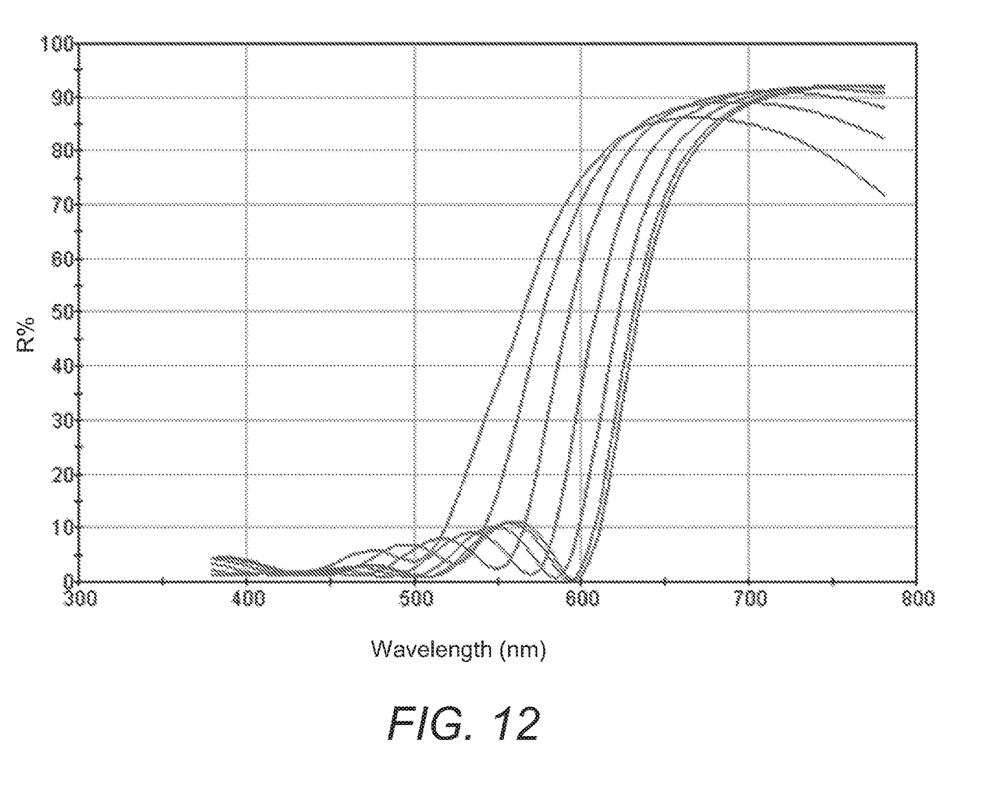
FIG. 12 is a graph illustrating reflection curves for a pigment with a low index polymer and a high index composite with a color shift from 0 degrees to 60 degrees.

An article was prepared having 7 layers with a high refractive index layer including a composite with iron oxide (30% volume) and titania (70% volume); the low refractive index layer includes a polymer with n=1.4 with no absorption, FIG. 12 shows the reflection curves 2 plotted for angles from 0 degrees to 60 degrees.

Example 11

Figure 13:
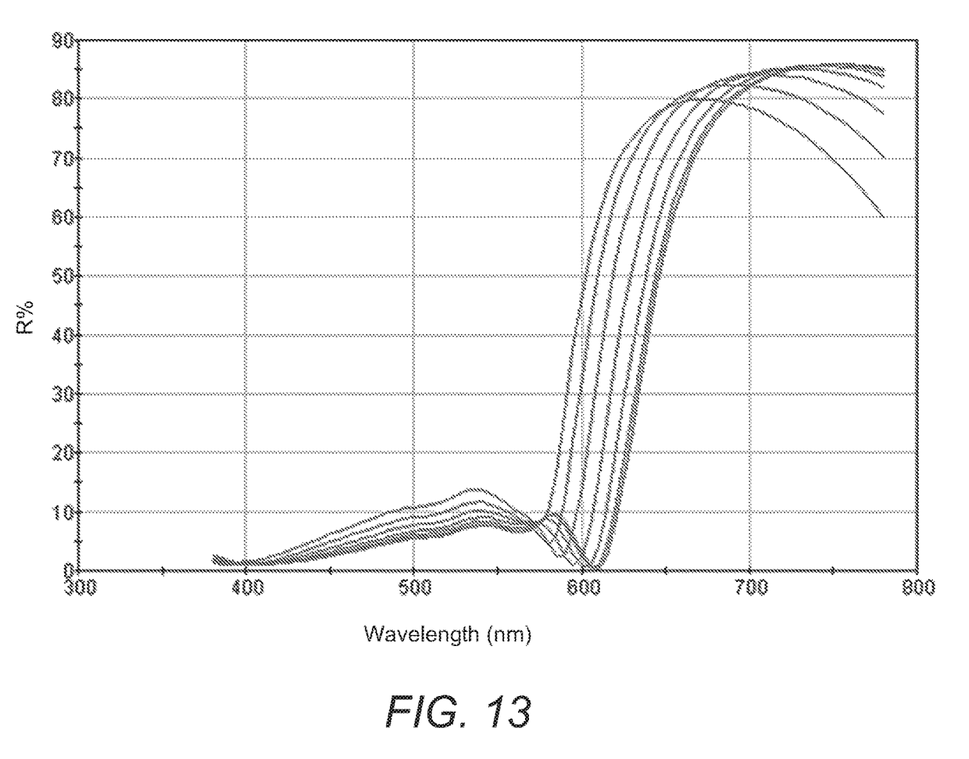
FIG. 13 is a graph illustrating reflection curves for a pigment similar to the one in FIG. 12, but including pigment red with the low index polymer.

An article similar to the article of Example 10 was prepared except that 30% volume DPP254 (red pigment) was added to the low refractive index layer. FIG. 13 shows the reflection curves 2 plotted for angles from 0 degrees to 60 degrees. The article reflected less of the unwanted light between 500 and 600 nm.

A method of forming an article can include depositing onto a substrate a stack of layers including a high refractive index layer and a low refractive index layer; wherein at least one layer of the stack includes a wavelength selective absorbing material; and wherein the stack of layers has a transparent region with an edge at a wavelength in which light is absorbed by the wavelength selective absorbing material, and a reflection band with an edge at a wavelength in which light is reflected. The stack of layers can be as described above.

The substrate can be any suitable material that can be used in the composition and/or can be used in the method of forming an article. The substrate can include a release layer. The substrate for use in the optical device and the method can be made of a flexible material. Non-limiting examples of substrate materials include polymer web, such as polyethylene terephthalate (PET), glass foil, glass sheets, polymeric foils, polymeric sheets, metal foils, metal sheets, ceramic foils, ceramic sheets, ionic liquid, paper, silicon wafers, etc. In an aspect, the substrate for use in the optical device can be different than the substrate for use in the method of making the article.

The method can also include drying and curing, optionally after each deposition and before a next layer is deposited. The method can further include, after deposition of all of the layers, water stripping the release layer, if present, and the stack of layers, filtering the deposited layers, drying, and grinding to form the article, for example, a pigment, a flake, or a foil.

The article can be formed using a liquid coating process for each layer. The liquid coating process can include, but is not limited to: slot-bead, slide bead, slot curtain, slide curtain, in single and multilayer coating, tensioned web slot, gravure, roll coating, and other liquid coating and printing processes that apply a layer onto a substrate or previously deposited layer to form a liquid layer or film that is subsequently dried and/or cured. A liquid coating process can allow for the accurate thickness control, for example, the liquid coating process can be used to deposit at least one layer in the stack of layers. Additionally, with a liquid coating process at least one layer of the stack of layers can be a composition including a liquid medium and the wavelength selective absorbing material. For example, the composition can include a polymer and nanoparticles of the wavelength selective absorbing materials.

In another aspect, the article can be formed using evaporation processes for the deposition of each layer.

In an aspect, a method of forming the article can include using a multi-channel slot die to apply two or more layers simultaneously and/or sequentially. This method can achieve a higher productivity with a less stages, such as a single stage. In the disclosed method, the layers of the stack that form the article do not require to be deposited under vacuum and thereby avoid the cost and loss of productivity associated with vacuum deposition techniques. The article can be subjected to a second drying and/or curing stage. The method does not use a vacuum step. The method can be used to form the articles discussed above with the layers discussed above.

A method of making a composition comprising dispersing the articles in a liquid medium to form the composition. Any suitable liquid medium can be used, such as polar or non-polar solvents. Non-limiting examples of a suitable liquid medium include acetates, such as ethyl acetate, propyl acetate, and butyl acetate; acetone; water; ketones, such as dimethyl ketone (DMK), methylethyl ketone (MEK), sec-butyl methyl ketone (SBMK), ter-butyl methyl ketone (TBMK), cyclopenthanon, and anisole; glycol derivatives, such as propylene glycol methyl ether, and propylene glycol methyl ether acetate; alcohols, such as isopropyl alcohol, and diacetone alcohol; esters, such as malonates; heterocyclic solvents, such as n-methyl pyrrolidone; hydrocarbons, such as toluene, and xylene; coalescing solvents, such as glycol ethers; and mixtures thereof. The liquid medium can be an organic matrix. The liquid medium can have a low refractive index. The composition can be an ink or a paint vehicle.

A method of making an optical device comprises applying to a surface of a substrate the composition. Non-limiting examples of a substrate suitable for use in the method of making the optical device are disclosed above. The optical device can be used in a decorative application.

For the purpose of the application, "nanoparticle(s)" is understood to mean having a median particle size of less than about 500 nm, for example, from about 100 nm to about 300 nm, and as a further example less than about 100 nm.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications can be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a coating and its many aspects, features and elements. Such a device can be dynamic in its use and operation, this disclosure is intended to encompass the equivalents, means, systems and methods of the use of the device and/or optical device of manufacture and its many aspects consistent with the description and spirit of the operations and functions disclosed herein. The claims of this application are likewise to be broadly construed. The description of the inventions herein in their many embodiments is merely exemplary in nature and, thus, variations that do not depart from the gist of the invention are intended to be within the scope of the invention. Such variations are not to be regarded as a departure from the spirit and scope of the invention.

What is claimed is:

1. An opaque article, comprising:
a stack of layers including a high refractive index layer and a low refractive index layer;
wherein at least one layer of the stack includes a wavelength selective absorbing material; and
wherein the stack of layers has a transparent region with an edge at a wavelength in which light is absorbed by the wavelength selective absorbing material, and a reflection band with an edge at a wavelength in which light is reflected by the wavelength selective absorbing material,
wherein the stack does not include a layer of metal.

2. The article of claim 1, wherein the high refractive index layer includes the wavelength selective absorbing material.

3. The article of claim 1, wherein the low refractive index layer includes the wavelength selective absorbing material.

4. The article of claim 1, wherein both the high refractive index layer and the low refractive index layer include the wavelength selective absorbing material.

5. The article of claim 1, wherein the wavelength selective absorbing material includes a metal sulfide, a ternary system, a metal oxide, a pigment, a dye, and combinations thereof.

6. The article of claim 5, wherein the metal sulfide is chosen from copper (I) sulfide, tin sulfide, nickel sulfide, silver sulfide, lead sulfide, molybdenum sulfide, iron disulfide, zinc sulfide, and combinations thereof.

7. The article of claim 5, wherein the ternary systems include chalcopyrite and bornite.

8. The article of claim 5, wherein the metal oxides include $CuO$, $SiO_2$, $TiO_2$, $Al_2O_3$, $ZrO_2$, $WO_3$, $VO_5$, ITO, $Ta_2O_5$, $CeO_2$, $Y_2O_3$, $Sc_2O_3$, $ZnO$, $In_2O_3$, $La_2O_3$, $MgO$, $Nd_2O_3$, $Pr_6O_{11}$, $Fe_2O_3$, $Fe_3O_4$, $SiO$, $SnO_2$, $FeO_x$, wherein x is an integer greater than 0, and their combinations.

9. The article of claim 1, wherein the wavelength selective absorbing material is a composite of a polymer and an absorbing pigment.

10. A composition, comprising:
the article of claim 1 dispersed in a liquid medium.

11. An optical device, comprising:
the composition of claim 10 applied to a surface of a substrate.

12. A method of making an article, comprising:
depositing onto a substrate a stack of layers including a high refractive index layer and a low refractive index layer;
wherein at least one layer of the stack includes a wavelength selective absorbing material; and
wherein the stack of layers has a transparent region with an edge at a wavelength in which light is absorbed by the wavelength selective absorbing material, and a reflection band with an edge at a wavelength in which light is reflected,
wherein the stack does not include a layer of metal; and
wherein the article is opaque.

13. The method of claim 12, wherein the article exhibits at least one property chosen from good hiding, high flop, or low color travel.

14. The method of claim 12, further comprising drying and curing each layer of the stack before a next layer of the stack is deposited.

15. The method of claim 12, wherein a liquid coating process is used to deposit at least one layer in the stack of layers.

16. The method of claim 12 wherein an evaporation process is used to deposit each layer.

17. The method of claim 12, wherein the layers of the stack do not require deposition under vacuum.

18. A method of making a composition comprising dispersing the article of claim 1 in a liquid medium.

* * * * *